(12) United States Patent
Tamura

(10) Patent No.: US 7,498,238 B2
(45) Date of Patent: Mar. 3, 2009

(54) CHIP AND METHOD FOR DICING WAFER INTO CHIPS

(75) Inventor: Muneo Tamura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 27 days.

(21) Appl. No.: 11/710,910

(22) Filed: Feb. 27, 2007

(65) Prior Publication Data

US 2007/0207594 A1    Sep. 6, 2007

(30) Foreign Application Priority Data

Mar. 3, 2006    (JP)  .............................. 2006-057336

(51) Int. Cl.
*H01L 21/46*    (2006.01)
*H01L 21/78*    (2006.01)
*H01L 21/301*    (2006.01)

(52) U.S. Cl. .................. 438/463; 438/113; 438/460; 257/E21.32; 257/E21.237; 257/E21.329; 257/E21.347

(58) Field of Classification Search ................ 438/113, 438/114, 460, 463, 311
See application file for complete search history.

(56) References Cited

U.S. PATENT DOCUMENTS

| | | | | |
|---|---|---|---|---|
| 6,992,026 | B2 * | 1/2006 | Fukuyo et al. ............. | 438/797 |
| 2005/0173387 | A1 | 8/2005 | Fukuyo et al. | |
| 2005/0181581 | A1 | 8/2005 | Fukuyo et al. | |
| 2005/0184037 | A1 | 8/2005 | Fukuyo et al. | |
| 2005/0189330 | A1 | 9/2005 | Fukuyo et al. | |
| 2005/0194364 | A1 | 9/2005 | Fukuyo et al. | |
| 2005/0202596 | A1 | 9/2005 | Fukuyo et al. | |
| 2006/0011593 | A1 | 1/2006 | Fukuyo et al. | |
| 2006/0040473 | A1 | 2/2006 | Fukuyo et al. | |
| 2006/0079024 | A1 | 4/2006 | Akram | |
| 2006/0160331 | A1 | 7/2006 | Fukuyo et al. | |
| 2007/0202619 | A1 | 8/2007 | Tamura et al. | |

FOREIGN PATENT DOCUMENTS

| | | |
|---|---|---|
| JP | A-20-055640 | 3/1985 |
| JP | A-60-055640 | 3/1985 |
| JP | A-06-077449 | 3/1994 |
| JP | A-2004-335655 | 11/2004 |

OTHER PUBLICATIONS

Office Action dated Jul. 24, 2008 in corresponding German patent application No. 10 2007 010 001.0-43 (and English translation).

* cited by examiner

*Primary Examiner*—David Nhu
(74) *Attorney, Agent, or Firm*—Posz Law Group, PLC

(57) ABSTRACT

A method for dicing a wafer including first and second layers is provided. A front surface of the first layer contacts a backside surface of the second layer. The method includes: forming a sealing film on the second layer; cutting the first layer from a backside surface along with a cutting line to form a notch; removing the sealing film; irradiating a laser beam on the front surface of the second layer along with the cutting line to form a reforming region in the second layer by a multi photon absorption effect; and dividing the wafer along with the cutting line from the reforming region as a starting point of dividing.

15 Claims, 8 Drawing Sheets

CHIP AND METHOD FOR DICING WAFER INTO CHIPS

CROSS REFERENCE TO RELATED APPLICATION

This application is based on Japanese Patent Application No. 2006-57336 filed on Mar. 3, 2006, the disclosure of which is incorporated herein by reference.

FIELD OF THE INVENTION

The present invention relates to a chip and a method for dicing a wafer into chips.

BACKGROUND OF THE INVENTION

A laser dicing method for cutting an object such as a wafer into multiple chips by using a laser beam has been developed. For example, a focus of the laser beam is adjusted at an inside of the object, and the laser beam is irradiated on the object so that a reforming region is formed in the object. The reforming region is formed by a multi-photon absorption effect, and includes, for example, a crack, a melting region, or a region having a refraction index different from the object. The reforming region provides a starting point of cutting. The reforming region is formed along with a cutting line of the object such that the reforming region is disposed inside of the object by a predetermined distance from a surface of the object as an incident surface of the laser beam. The object is cut along with the reforming region so that the object is cut into multiple chips. This method is disclosed in, for example, US Patent Application Publication No. 2006-0160331.

Another method for forming multiple reforming regions is disclosed in JP-A-2002-205180. Specifically, a focus point of a laser beam is adjusted at an inside of an object. Then, the laser beam is irradiated on the object, so that the reforming region is formed at the inside of the object along with a cutting line. Further, the focus point in an incident beam direction of the laser beam is changed so that multiple reforming regions are formed along with the incident beam direction, which is perpendicular to the surface of the object. In this case, since multiple reforming regions are arranged along with the incident beam direction, the number of staring points of cutting increases. Thus, even when the object has a large thickness, the object is easily cut.

Further another method for cutting an object by using a laser beam is disclosed in US Patent Application Publication No. 2006-0011593. In this method, the object has a plate shape, and includes a substrate or the like. An expansible film is formed on one side of the object, and the laser beam is irradiated on the other side of the object so that the other side provides an incidence surface of the laser beam. A focus point of the laser beam is adjusted at an inside of the object, and then, the laser beam is irradiated on the object. Thus a reforming region is formed at the inside of the object by a multi photon absorption effect. In this case, the reforming region includes a melting process region. The reforming region provides a starting point of cutting along with a cutting line, and is disposed inside of the object by a predetermined distance from the other side of the object. Then, the expansible film is expanded so that the object is cut into multiple parts along with the starting point of cutting. In this case, the parts are separated one another. In this case, after the reforming regions are formed at the inside of the object, the expansible film is expanded. Thus, a tensile stress is applied to the reforming regions appropriately, so that the object is accurately and easily cut from the staring point of cutting with a comparatively small force.

On the other hand, a blade dicing method is used for cutting and separating a wafer by rotating a dicing blade having a diamond abrasive grain. In this case, a process time for cutting the wafer is comparatively short. Therefore, a throughput (i.e., productivity per an unit time) is high, and the blade dicing method is suitable for mass production.

However, the blade dicing method has the following difficulties.

(1) It is necessary for the blade dicing method to have a margin for a thickness of the dicing blade. Thus, the number of chips cut from the wafer is reduced by the margin. Thus, a product yield of the chips is limited.

(2) When the wafer is cut by the dicing blade, abrasive heat and cutting scrap are generated. Accordingly, it is necessary to cool and wash a cutting portion of the wafer. Specifically, cooling and washing water is introduced to the cutting portion of the wafer.

In this case, when the chip includes a construction having a movable portion, movable performance of the chip may be reduced in a case where the cutting scrap and/or the cooling water penetrates into the construction. Here, the construction having the movable portion is, for example, a sensor such as a pressure sensor, an acceleration sensor and an ultrasonic sensor having a piezo electric element or a capacitor or a micro machine, which is formed by using a MEMS (i.e., micro electro mechanical system) technique.

To protect the construction from introducing the cutting scrap and the cooling water thereinto, a protection layer is stacked on a semiconductor layer, so that a semiconductor substrate has a double-layer structure. In this case, if a clearance is formed between the protection layer and the semiconductor layer, the cutting scrap and/or the cooling water may penetrate into the clearance. Thus, the performance of the movable portion is reduced. Here, a technique for forming a multi-layer substrate is, for example, a bonding method with using a silicon series bonding member, a bonding method with a low melting point glass, a direct bonding method, and an anodic bonding method.

FIGS. 11-13 show a wafer 10 and a chip 11 according to a related art of the present disclosure. Specifically, the wafer 10 includes multiple chips 11, and each chip 11 has a construction 12 formed by a MEMS technique.

The wafer 10 has a thin disk shape, and multiple chips 11 having the same construction are formed on one side 10b of the wafer 10. The chips 11 are arranged on the wafer 10 to be a grid shape. A cutting line K is formed between the chips 11. The wafer 10 is to be cut along with the cutting line K.

The wafer 10 has a SOI structure, which is prepared by bonding together. Specifically, a silicon substrate layer 19 made of silicon single crystal, a buried oxide layer 18 (i.e., BOX layer), and a SOI layer 13 made of silicon single crystal are stacked in this order from a bottom to a top of the wafer 10. The BOX layer 18 as an insulation layer is formed on the SOI layer 13 so that the SOI structure is provided.

The wafer 10 having the SOI structure is formed such that two wafers having an oxide film on one surface thereof are bonded each other with the oxide film therebetween, and then, one of wafers is ground so as to have a predetermined thickness. The one surface of each wafer is defined as a bonding surface and is a mirror finished surface. The ground wafer provides the SOI layer 13, the other wafer provides the silicon substrate layer 19, and the oxide film provides the BOX layer 18.

Each semiconductor chip 11 in the wafer 10 includes a construction 12, an electrode pad 14, a trench 15, a cap portion 16, a seal member 17 and the like, which are formed by using a MEMS technique.

The construction 12 having a movable portion such as a sensor element and a micro machine is formed in the SOI layer 13, in which an impurity is diffused with high concentration.

The electrode pad 14 is made of a metallic film disposed on a surface of the SOI layer 13, and led from the construction 12. The metallic film is formed by a PVD (i.e., physical vapor deposition) method, a printing method or the like.

A trench 15 is formed around a part of the SOI layer 13 under the electrode pad 14 and around another part of the SOI layer 13 providing the construction 12. The trench 15 electrically separates a wiring in the SOI layer 13 and other parts of the wafer 10. This separation is defined as element separation. Thus, each part constituting the construction 12 is movably independent from each other.

The cap portion 16 made of bulk silicon such as poly crystal silicon, amorphous silicon and single crystal silicon protects and covers the construction 12. The cap portion 16 is bonded to the surface 10b of the wafer 10 with a bonding member 20 such as a silicon series bonding member and a polyimide series bonding member. Here, to improve movement of the movable portion in the construction 12, a clearance 30 is formed between the inner wall of the cap portion 16 and the construction 12.

The cap portion 16 formed in each chip 11 is integrated continuously on a whole surface of the wafer 10. Thus, only a part is exposed on the surface 10b of the wafer 10, the part not covered with the cap portion 16. Specifically, the part is disposed around the electrode pad 14.

An outer periphery 10h of the wafer 10 on the surface 10b is covered with the cap portion 16.

The cap portion 16 is stacked on the surface 10b of the wafer 10 so that the wafer 10 has double-layered structure. The wafer 10 with the cap portion 16 is separated and cut in a stacking direction (i.e., a thickness direction of the wafer 10) so that multiple chips 11 are obtained.

The seal member 17 is embedded in the trench 15, and the seal member 17 made of plastic material having insulation property is connected to the cap portion 16. The seal member 17 seals the cap portion 16.

When the wafer 10 is cut and separated into multiple chips 11 by the blade dicing method, cooling and washing water is introduced to the cutting portion of the wafer 10 for cooling and washing the cutting portion. In this case, the water and a cutting scrap of the wafer 10 and/or the cap portion 16 may penetrate into the construction 12 through the clearance 30 between the seal member 17 and the trench 15 or the cap portion 16.

When the cutting scrap and/or the water penetrate into the construction 12, performance of the construction 12 is reduced. Thus, yielding ratio and quality of the chips 11 separated from the wafer 10 are reduced.

It is considered that sealing with the seal member 17 is improved, i.e., tightened for preventing the water and the cutting scrap from penetrating into the construction 12. However, in this case, a manufacturing cost may increase.

Further, even when the sealing with the seal member 17 is improved, it is difficult to prevent the water and the cutting scrap completely from penetrating into the construction 12.

In the laser dicing method described above, it is not necessary for the wafer 10 to have a margin for a thickness of the dicing blade, and no water is used in the laser dicing method. Thus, the above difficulties of (1) and (2) are avoidable.

When the wafer are made of a single layer substrate, or when the wafer has no construction formed by the MEMS technique, the wafer is easily and accurately cut and separated by the laser dicing method.

However, it is difficult for the wafer 10 having the cap portion or a wafer having a double-layered structure to form the reforming region in the wafer 10 and the cap portion 16 preferably.

This is because optical properties among the wafer 10, the cap portion 16 and the bonding member 20 are different from one another. Specifically, refraction indexes of the wafer 10, the cap portion 16 and the bonding member 20 in relation to the laser beam L are different from one another. Accordingly, a part of the laser beam L is reflected by a boundary between the wafer 10 and the bonding member 20 or a boundary between the bonding member 20 and the cap portion 16. Thus, the reflected laser beam and the incident laser beam interfere with each other so that they are cancelled each other. The energy of the laser beam L is much attenuated at a deep place apart from the incident surface of the laser beam L. At the deep place, the energy of the laser beam L is insufficient for generating the multi-photon absorption effect, and therefore, it is difficult to form the reforming region sufficiently.

Here, the bonding member 20 bonds the cap portion 16 and the wafer 10, and may not be disposed on the cutting line K in some case. In this case, the bonding member 20 is disposed outside of the construction 12, and further disposed inside of the cap portion 16. In this case, since optical properties among air between the cap portion 16 and the wafer 10, the cap portion 16 and the wafer 10 are different, so that refraction indexes among the air, the wafer 10 and the cap portion 16 in relation to the laser beam L are different from one another. Thus, a part of the laser beam L is reflected by a boundary between the wafer 10 and the air or a boundary between the air and the cap portion 16. Therefore, it is difficult to form the reforming region in the wafer 10 and the cap portion 16 sufficiently.

Further when the wafer 10 has the double-layered structure, optical properties among layers are different, so that refraction indexes among the layers are different from each other. Thus, a part of the laser beam L is reflected by a boundary between the layers. Therefore, it is difficult to form the reforming region sufficiently.

When the reforming region is not formed sufficiently in the wafer 10, an unwanted crack may be generated in the wafer 10 in case of cutting and separating. Thus, it is difficult for the wafer 10 to cut and separate along with the cutting line K. Thus, the yielding ratio and quality of the chips 11 are reduced.

Further, it takes a long time to form the reforming region in the wafer 10 having the cap portion 16 or the wafer having the double-layered structure by using the laser dicing method. Thus, the throughput of the chips 11 with the laser dicing method is lower than that with the blade dicing method. Accordingly, the laser dicing method is not suitable for mass production.

Thus, it is required to provide a method for cutting a wafer with high throughput and low cost, the method providing to prevent foreign substance such as cutting scrap from penetrating into a chip. Further, it is required to provide a wafer or a chip with high throughput and low cost, the wafer or the chip having no foreign substance.

SUMMARY OF THE INVENTION

In view of the above-described problem, it is an object of the present disclosure to provide a chip. It is another object to provide a method for dicing a wafer into chips.

According to a first aspect of the present disclosure, a method for dicing a wafer including a first layer and a second layer is provided. The second layer is disposed on the first layer so that a front surface of the first layer contacts a backside surface of the second layer. The method includes: forming a sealing film on the second layer to cover a front surface of the second layer and a part of the front surface of the first layer in a liquid-tightly manner, the part of the front surface of the first layer exposed from the second layer; cutting the first layer from a backside surface of the first layer along with a cutting line so that a notch is formed on the backside surface of the first layer; removing the sealing film from the second layer; irradiating a laser beam on the front surface of the second layer along with the cutting line after the removing the sealing film in such a manner that the laser beam is focused on an inside of the second layer in order to form a reforming region in the second layer by a multi photon absorption effect; and dividing the wafer along with the cutting line from the reforming region as a starting point of dividing.

In the above method, since the sealing film covers the front surface of the second layer and the part of the front surface of the first layer in liquid-tightly manner, a cutting scrap and cooling water do not penetrate into a clearance between the first and second layers. Thus, product yielding ratio and quality of chips are improved. Further, since the notch is formed by cutting, throughput of the method becomes higher.

According to a second aspect of the p resent disclosure, a method for dicing a wafer including a first layer and a second layer is provided. The second layer is disposed on the first layer so that a front surface of the first layer contacts a backside surface of the second layer. The method includes: irradiating a laser beam on a backside surface of the first layer along with a cutting line in such a manner that the laser beam is focused on an inside of the first layer in order to form a first reforming region in the first layer by a multi photon absorption effect; irradiating the laser beam on a front surface of the second layer along with the cutting line in such a manner that the laser beam is focused on an inside of the second layer in order to form a second reforming region in the second layer by the multi photon absorption effect; and dividing the wafer along with the cutting line from the first and second reforming regions as a starting point of dividing.

In the above method, the reforming regions are accurately and surely formed in the first and second layers. Thus, product yielding ratio and quality of chips are improved.

According to a third aspect of the present disclosure, a method for dicing a wafer including a first layer and a second layer is provided. The second layer is disposed on the first layer so that a front surface of the first layer contacts a backside surface of the second layer. The method includes: irradiating a laser beam on a backside surface of the first layer along with a cutting line in such a manner that the laser beam is focused on an inside of the second layer in order to form a second reforming region in the second layer by a multi photon absorption effect; irradiating the laser beam on the backside surface of the first layer along with the cutting line in such a manner that the laser beam is focused on an inside of the first layer in order to form a first reforming region in the first layer by the multi photon absorption effect; and dividing the wafer along with the cutting line from the first and second reforming regions as a starting point of dividing.

In the above method, the reforming regions are accurately and surely formed in the first and second layers. Thus, product yielding ratio and quality of chips are improved.

According to a fourth aspect of the present disclosure, a chip includes: a first layer; a second layer disposed on the first layer. The first layer has a first periphery sidewall. The second layer has a second periphery sidewall. The second periphery sidewall includes a reforming region on the second periphery sidewall. The first periphery sidewall includes no reforming region on the first periphery sidewall. The reforming region is provided by a multi photon absorption effect of irradiation of a laser beam. In the above chip, product yielding ratio and quality of a chip are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

FIGS. 1 to 5 show a method for cutting a wafer 10 along with a cutting line Ka.

Figure 1:
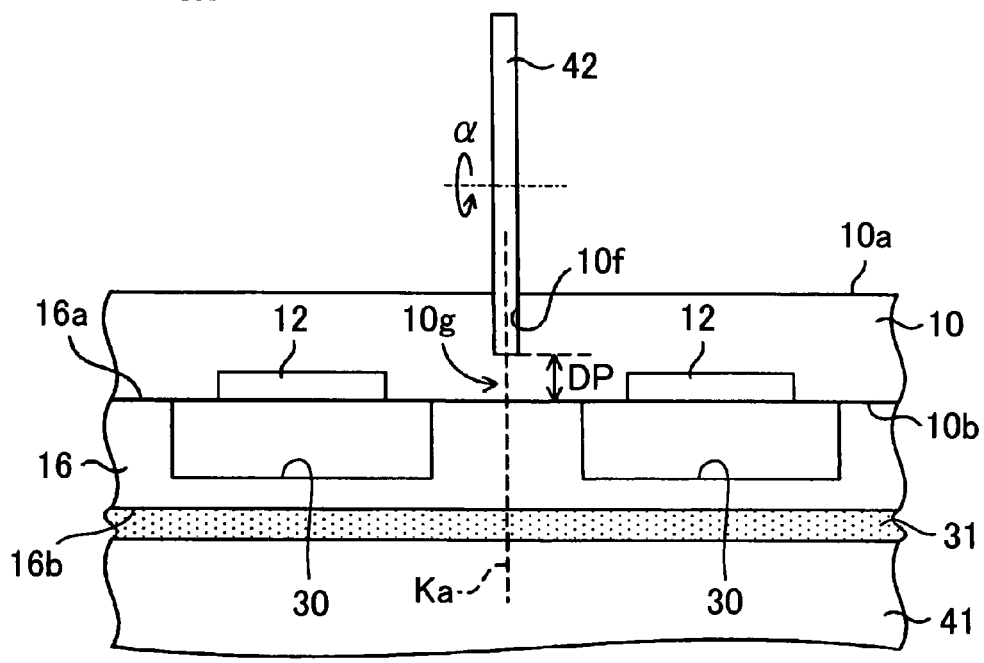
FIG. 1 is a cross sectional view showing a wafer taken along line I-I in FIG. 12 and explaining a dicing process according to a first embodiment.

FIG. 1 shows a first step of the method for cutting the wafer 10. Firstly, a sealing film 31 is bonded to the surface 16b of the cap portion 16. Then, the backside 10a of the wafer 10 turns up, and the surface 16b of the cap portion 16 turns down. The wafer 10 is mounted on a stage 41, i.e., a specimen support of a blade dicing device so that the sealing film 31 contacts the top of the stage 41.

Then, a dicing blade 42 having a diamond abrasive grain embedded in the dicing blade 42 is rotated with high speed in a direction shown as α in FIG. 1. The rotating blade 42 press-contacts the backside 10a of the wafer 10 along with the cutting line Ka.

Thus, the wafer 10 is partially cut from the backside 10a so that a notch 10f is formed on the backside 10a of the wafer 10.

Then, the sealing film 31 is removed from the surface 16b of the cap portion 16. At this time, the wafer 10 is not completely cut in a thickness direction so that a part 10g of the wafer 10 is left. The part 10g of the wafer 10 is disposed from the surface 10b to a thickness of DP, i.e., the part 10g has the thickness of DP. The total of the thickness DP of the part 10g and the depth of the notch 10f provides a thickness of the wafer 10.

A width W of the notch 10f is substantially equal to the thickness of the dicing blade 42.

Figure 2:
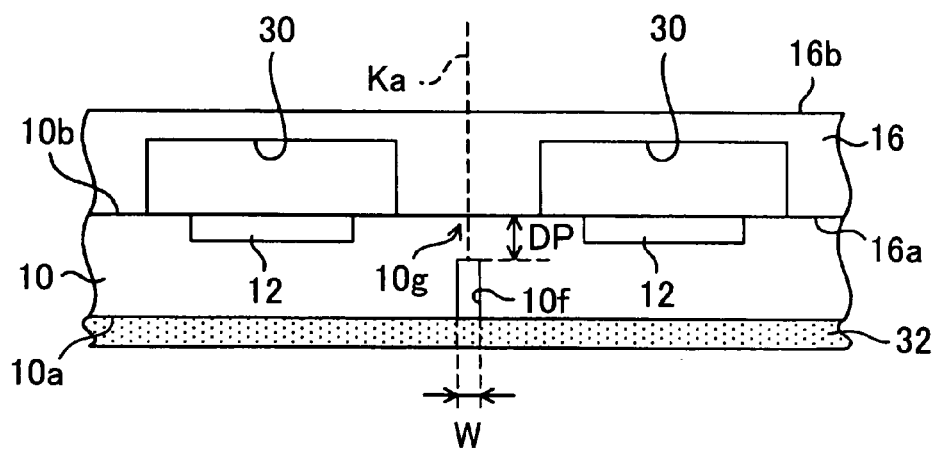
FIG. 2 is a cross sectional view showing the wafer taken along line I-I in FIG. 12 and explaining the dicing process according to the first embodiment.

FIG. 2 shows a second step. A dicing film 32 is formed on the backside 10a of the wafer 10, on which the notch 10f is formed. The dicing film 32 is defined as a dicing sheet, a dicing tape or an expand tape.

The dicing film 32 is made of a plastic film having expansible property so that the dicing film 32 is expansible according to a force in an expansion direction or heat. The dicing film 32 is bonded to a whole area of the backside 10a of the wafer 10 with an adhesive member.

Then, the wafer 10 turns over so that the surface 10b of the wafer 10 and the surface 16b of the cap portion 16 turn up. Then, the wafer 10 is mounted on a stage of a laser beam processing device.

Figure 3:
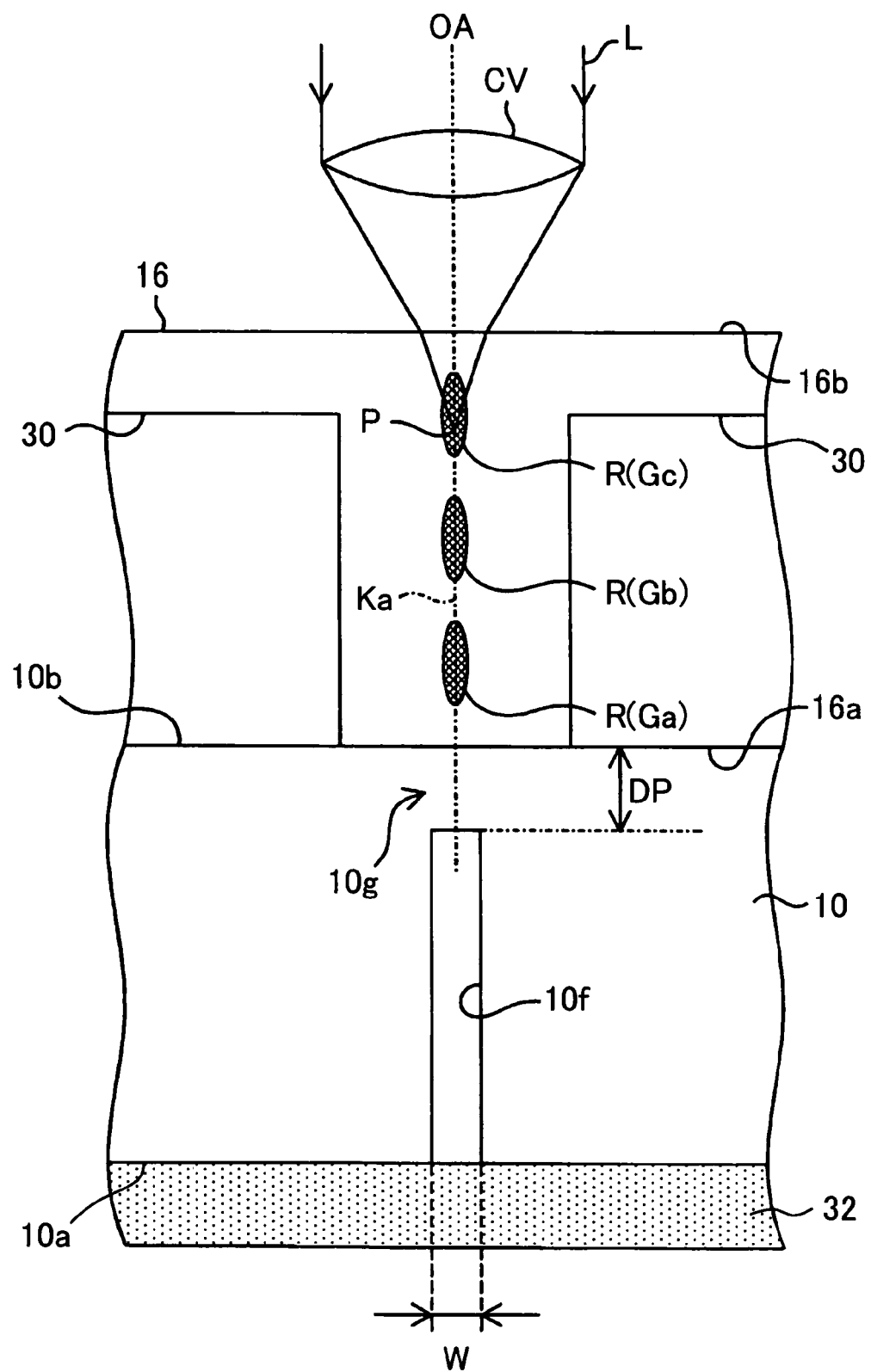
FIG. 3 is a cross sectional view showing the wafer taken along line I-I in FIG. 12 and explaining the dicing process according to the first embodiment.
Figure 4:
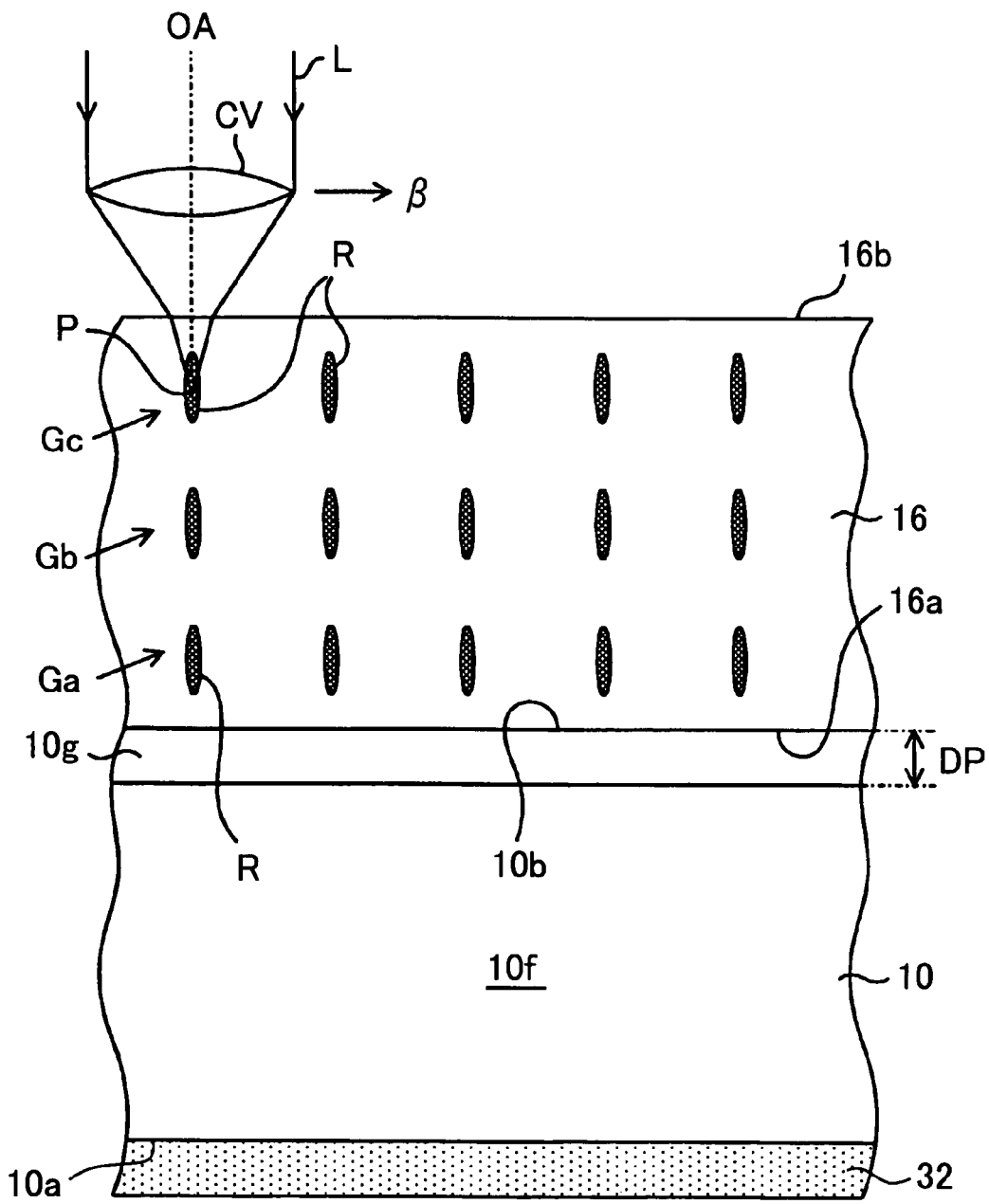
FIG. 4 is a cross sectional view showing the wafer taken along line IV-IV in FIG. 12 and explaining the dicing process according to the first embodiment.

FIGS. 3 and 4 show a third step. The laser beam processing device includes a laser beam source (not shown) for irradiating the laser beam L and a condenser lens CV. The laser beam L has an optical axis OA, which is perpendicular to the surface 16b of the cap portion 16. The laser beam L is irradiated on the surface 16b of the cap portion 16 through the condenser lens CV so that the surface 16b provides an incident surface of the laser beam L. The focus point P is adjusted at a predetermined depth from the surface 16b of the cap portion 16. The laser beam L is focused at the focus point P (i.e., a condensing point of the laser beam L). Thus, the reforming region R is formed at the focus point P in the cap portion 16.

The laser beam source is, for example, a YAG laser, and the laser beam L has a wavelength of 1064 nanometers in an infrared light region.

The reforming region R includes a melting processed region mainly formed by the multi-photon absorption effect, which is generated by the laser beam irradiation.

The inside of the cap portion 16 at the focus point P is locally heated by the multi photon absorption effect of the laser beam L, and the inside of the cap portion 16 is melted partially. Then, the partially melted cap portion 16 is hardened again. Thus, the part of the cap portion 16, which is melted and hardened again, provides the reforming region R.

The melting process region is a region, a phase of which is changed, or a region, a crystal structure of which is changed. Thus, the melting process region is one of regions in the cap portion 16, which are a region changed from single crystal silicon to amorphous silicon, a region changed from single crystal silicon to poly crystal silicon, and a region changed from single crystal silicon to mixture of amorphous silicon and poly crystal silicon. Since the cap portion 16 is made of bulk silicon, the melting process region is mainly made of poly crystal silicon.

Here, the melting process region is not formed by an ordinary laser beam heating effect in such a manner that the laser beam L is absorbed in the cap portion 16, but the melting process region is mainly formed by the multi photon absorption effect.

Accordingly, the laser beam L is mainly absorbed at the focus point P in the cap portion 16. Thus, the surface 16b of the cap portion 16 is not melted and reformed.

The laser beam processing device irradiates the laser beam L in a pulse manner and scans the laser beam along with the cutting line Ka so that the focus point P is moved in a direction β in FIG. 4 under a condition where a depth of the focus point P in the cap portion 16 is constant.

Although the laser beam processing device scans the laser beam L, the stage for mounting the wafer 10 may be displaced in a direction perpendicular to the laser beam L (i.e., perpendicular to the incident beam direction or the irradiation direction of the laser beam L). In this case, the irradiation of the laser beam L is not moved.

Thus, the scanning of the laser beam L or the displacement of the wafer 10 provides to move the focus point P relatively to the wafer 10 along with the cutting line Ka.

In the above steps, one reforming layer Ga, Gb, Gc composed of multiple reforming regions R is formed in the cap portion 16. The reforming regions R in the reforming layer Ga, Gb, Gc have the same depth from the surface 16b of the cap portion 16 so that each reforming region R is disposed at a predetermined depth from the surface 16b of the cap portion 16. Further, the reforming regions R are arranged at predetermined intervals in a direction in parallel to the surface 16b and the backside surface 16a of the cap portion 16. Here, the depth of the focus point P in the cap portion 16 is a distance from the surface 16b of the cap portion 16 to the focus point P.

The laser beam processing device changes the depth of the focus point P in the cap portion 16 so that multiple reforming layers Ga, Gb, Gc are formed in the cap portion 16. The reforming layers Ga, Gb, Gc are disposed along with the cutting line Ka of the cap portion 16 and separated from, adjacent to, or overlapped each other in a depth direction of the cap portion 16. The depth direction of the cap portion 16 is a thickness direction, a cross sectional direction, or a direction perpendicular to the surface 16b of the cap portion 16.

Specifically, the focus point P of the laser beam L in the cap portion 16 (i.e., the depth of the focus point P) is changed by multiple times so that multiple reforming layers Ga, Gb, Gc are formed. The reforming regions R in the reforming layers Ga, Gb, Gc along with the depth direction of the cap portion 16 are separated from, adjacent to, or overlapped each other.

For example, firstly, the depth of the focus point P is set to be adjacent to the backside surface 16a of the cap portion 16. Then, the focus point P is moved relative to the wafer 10 so that the first reforming layer Ga is formed in the cap portion 16. The first reforming layer Ga is a bottom layer. Then, the depth of the focus point P is set to be in a middle position between the surface 16b and the backside surface 16a of the cap portion 16. Under this condition, the focus point P is moved along with the cutting line Ka relative to the wafer 10 so that the second reforming layer Gb is formed. The second reforming layer Gb is a middle layer. Then, the depth of the focus point P is set to be adjacent to the surface 16b of the cap portion 16. Then, the focus point P is moved relative to the wafer 10 so that the third reforming layer Gc is formed in the cap portion 16. The third reforming layer Gc is a top layer.

In FIGS. 3 and 4, three reforming layers Ga, Gb, Gc are formed in the cap portion 16. Alternatively, the number of reforming layers Ga, Gb, Gc may be one or more. Specifically, the number of reforming layers Ga, Gb, Gc may be one, two, four or more than four. The number of reforming layers Ga, Gb, Gc is determined in accordance with the thickness of the cap portion 16.

Here, it is preferred that the reforming layers Ga, Gb, Gc are formed in an order from the first layer to the third layer.

That is, the reforming layers Ga, Gb, Gc are formed in an order from the furthest (deepest) layer from the surface 16b of the cap portion 16 to the nearest (shallowest) layer.

For example, assuming that the top layer Gc near the surface 16b of the cap portion 16 is firstly formed, and then, the bottom layer Ga far from the surface 16b is formed. In this case, the laser beam L to form the bottom layer Ga may be scattered by the top layer Gc, which is formed firstly. Thus, each reforming region R in the reforming layer Ga may have variation of dimensions. Thus, it is difficult to form the reforming regions R in the bottom layer Ga homogeneously.

However, when the reforming layers Ga-Gc are formed in the order from the bottom layer Ga to the top layer Gc (i.e., in the order from the farthest reforming layer Ga from the surface 16b to the nearest reforming layer Gc), no reforming region R is disposed between the surface 16b and the focus point P. Thus, the laser beam L is not scattered by the reforming region R. Accordingly, multiple reforming layers Ga-Gc are homogeneously formed.

In some cases, even if the reforming layers Ga-Gc are formed in the order from the top layer Gc nearest the surface 16b to the bottom layer Ga farthest the surface 16b, of even if the reforming layers Ga-Gc are formed in random, the reforming layers Ga-Gc may be formed homogeneously. Thus, the order of formation of the reforming layers Ga-Gc may be determined appropriately based on an experiment.

A method for changing the depth of the focus point P in the cap portion 16 in order to form multiple reforming layers Ga-Gc is performed as follows.

(1) A first method is such that a laser head composed of the laser beam source and the condenser lens CV is displaced up and down in a vertical direction of the surface 16b of the cap portion 16.

(2) A second method is such that the stage 41 is displaced up and down in the vertical direction of the surface 16b.

(3) A third method is a combination of the first and second method so that both of the laser head and the stage 41 are displaced oppositely in the vertical direction. In this case, a process time for forming the reforming layers Ga-Gc is shorter than that of the first or second method.

Figure 5:
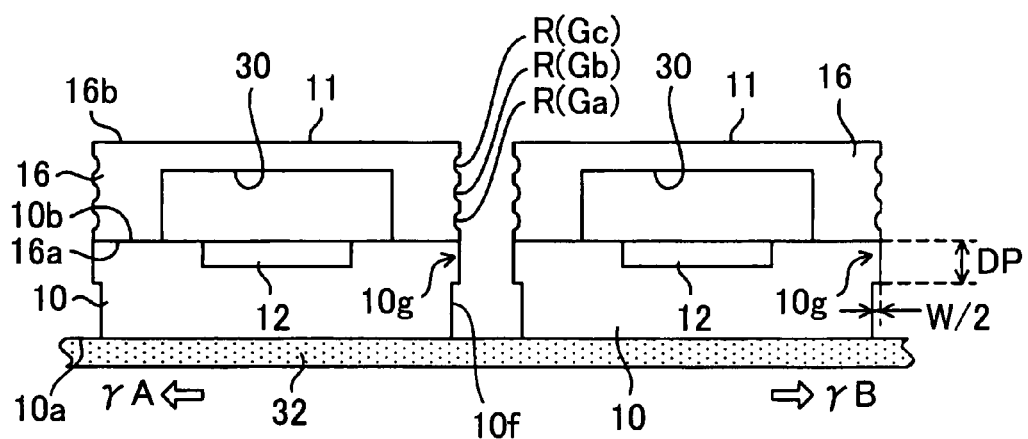
FIG. 5 is a cross sectional view showing the wafer taken along line I-I in FIG. 12 and explaining the dicing process according to the first embodiment.

FIG. 5 shows a fourth step. After the reforming layers Ga-Gc are formed in the cap portion 16, the dicing film 32 is expanded along with a horizontal direction (i.e., βA-βB), which is perpendicular to the cutting line Ka. Thus, a tensile stress is applied to the reforming regions Ga-Gc.

Then, a shear stress is generated in the inside of the cap portion 16. Firstly, a crack is generated from the bottom layer Ga as a starting point of cracking. The bottom layer Ga is nearest the dicing film 32. Specifically, the crack is generated along with the depth direction of the cap portion 16. Then, the crack is generated from the middle layer Gb as a starting point of cracking along with the depth direction. After that, the crack is generated from the top layer Gc as a starting point along with the depth direction. Thus, the crack from the reforming layers Ga-Gc grows and connects each other. When the grown crack reaches the surface 16b and the backside surface 16a, the cap portion 16 is cut and separated.

Further, when the dicing film 32 is expanded, a shear stress is generated in the part 10g of the wafer 10, so that the crack is generated from the bottom layer Ga as a staring point of cracking. Then, the crack from the bottom layer Ga proceeds into the part 10g, and further, the crack grows and connects to the notch 10f. Thus, the part 10g of the wafer 10 is cut and separated.

Here, since the reforming layers Ga-Gc are formed along with the cutting line Ka, the cap portion 16 and the part 10g of the wafer 10 are cut and separated accurately along with the cutting line Ka with a comparatively small force. In this case, no unwanted crack is generated in the cap portion 16 and the part 10g. Specifically, an appropriate tensile stress is applied to the reforming layers Ga-Gc by expanding the dicing film 32, so that the crack is generated from each reforming region R in the reforming layers Ga-Gc as a starting point of cracking.

Figure 11:
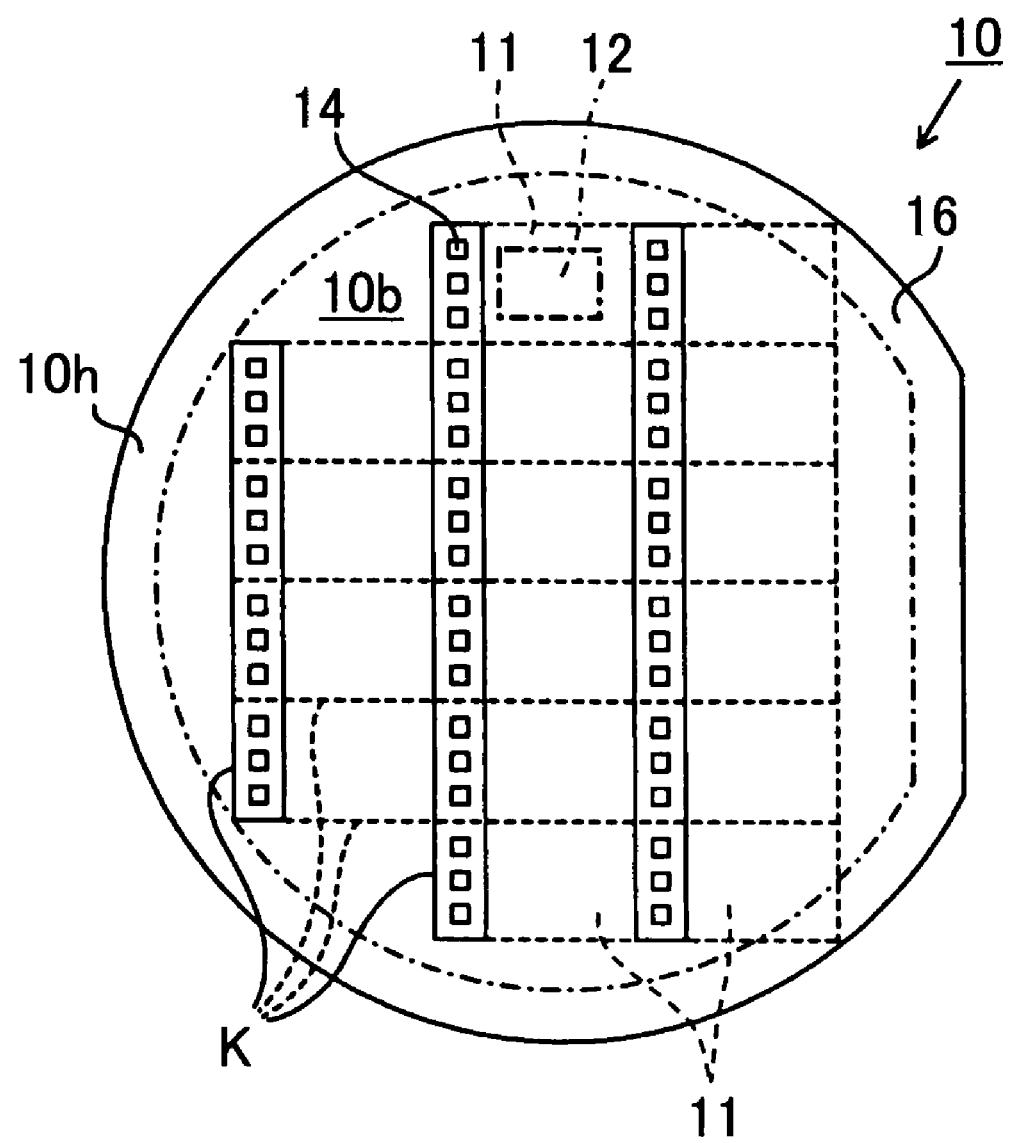
FIG. 11 is a plan view showing a wafer including a chip with a construction according to a related art.
Figure 12:
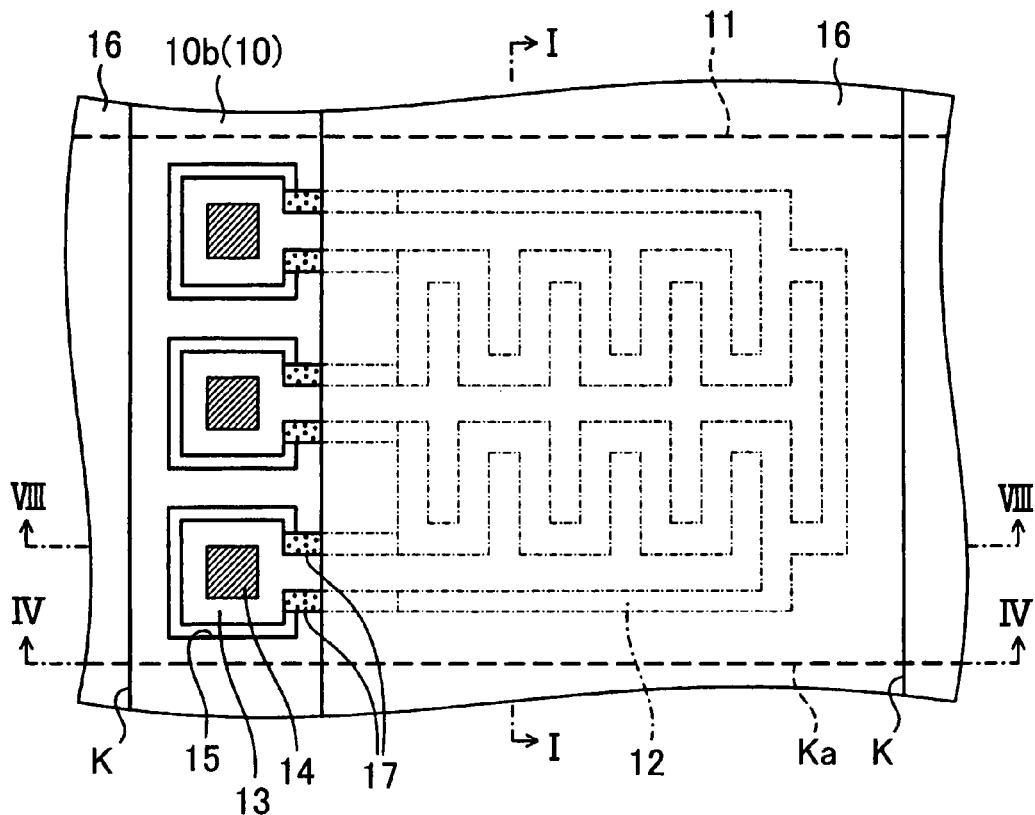
FIG. 12 is a partially enlarged plan view showing the wafer in FIG. 11.
Figure 13:
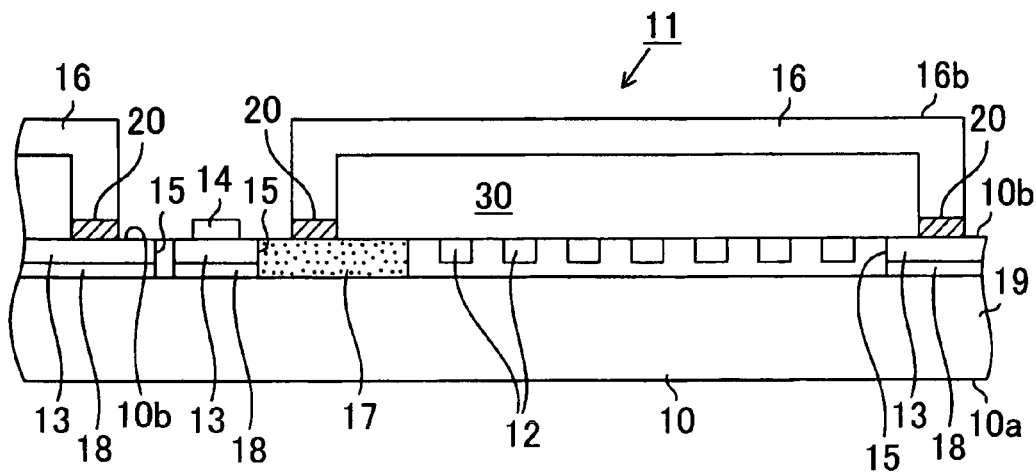
FIG. 13 is a cross sectional view showing the wafer taken along line XIII-XIII in FIG. 12.

As shown in FIG. 11, multiple chips 11 are arranged to be a grid shape on the surface 10b of the wafer 10 having a thin disk shape. The cutting line Ka is disposed between the chips 11. Thus, multiple cutting lines Ka are arranged to be a lattice on the surface 10b of the wafer 10.

After the reforming layers Ga-Gc are formed along with each cutting line Ka, the dicing film 32 is expanded, so that the wafer 10 with the cap portion 16 are separated. Thus, the chip 11 is separated from the wafer 10.

The above method has the following characteristics.

Firstly, in the first step shown in FIG. 1, the notch 10f is formed on the backside surface 10a of the wafer 10 by rotating the dicing blade 42 with high speed. In this case, abrasive heat and cutting scrap are generated. Therefore, it is required for the wafer 10 to splash a cooling and washing water at the cutting portion of the wafer 10 in order to cool and wash the wafer 10.

At this time, if the cutting scrap of the wafer 10 and the cooling water penetrate into the construction 12 through the clearance 30 among the seal member 17, the trench 15 and the cap portion 16, performance of the construction 12 may be reduced, and product yielding ratio and quality of the chip 11 may be reduced. However, in this embodiment, the sealing film 31 is formed on the surface 16b of the cap portion 16, and the surface 16b of the cap portion 16 turns down and the backside surface 16a of the cap portion 16 turns up. Under this condition, the backside surface 10a of the wafer 10 is cut with the dicing blade 42.

Here, the outer periphery 10h of the wafer 10 on the surface 10b is covered with the cap portion 16, which is integrally formed over the wafer 10. Accordingly, when the sealing film 31 is bonded to a whole surface 16b of the cap portion 16, a part of the surface 10b of the wafer 10 such as a periphery of the electrode pad 14, which is not covered with the cap portion 16, is also covered with the sealing film 31. The sealing film 31 is bonded to the outer periphery 10h of the wafer 10.

Thus, in this embodiment, the surface 16b of the cap portion 16 and the surface 10b of the wafer 10 exposed from the cap portion 16 (e.g., the periphery of the electrode pad 14) are sealed with the sealing film 31. Thus, the cooling water is not introduced on the surface 16b of the cap portion 16 and the surface 10b of the wafer 10. Thus, the cutting scrap and the cooling water are prevented from penetrating into the construction 12. Thus, the product yielding ratio and the quality of the chip 11 are improved.

Further, the sealing with the seal member 17 may be simplified or eliminated. Thus, a manufacturing cost of the chip 11 is reduced, compared with a conventional method with using the seal member 17.

The sealing film 31 can be made of any material as long as the sealing film 31 seals the surface 16 of the cap portion 16 with liquid-tightly. For example, the sealing film 31 is made of rubber material, plastic material or metallic material. To obtain the liquid-tight sealing with the sealing film 31, the material of the sealing film 31 is appropriately selected based on an experiment. Specifically, the sealing film 31 may be made of the same material as the dicing film 32.

In the first step, the surface 16b of the cap portion 16 may be adhered to the surface of the stage 41 so that the surface 16b of the cap portion 16 and the surface 10b of the wafer 10 exposed from the cap portion 16 are liquid-tightly sealed with the surface of the stage 41. In this case, the sealing film 31 is not necessary.

Secondly, in the first step, when the wafer 10 is completely cut along with the thickness direction of the wafer 10, the surface 10b of the wafer 10 and the backside surface 16a of the cap portion 16 are exposed through the notch 10f. Thus, the cooling water may be introduced on the surface 10b and the backside surface 16a, so that the cutting scrap and the water may penetrate into the construction 12. However, in this embodiment, the wafer 10 is not completely cut and separated along with the thickness direction of the wafer 10. Specifically, the part 10g of the wafer 10, which is set back from the surface 10b of the wafer 10 by the predetermined thickness DP, remains without cutting completely.

Accordingly, the part 10g of the wafer 10 functions as a wall for separating the water from the surface 10b and the backside surface 16a, so that the surface 10b and the backside surface 16a are not exposed through the notch 10f. Thus, the surface 10b and the backside surface 16a do not contact the water, and the cutting scrap and the water are prevented from penetrating into the construction 12. Thus, the product yielding ratio and the quality of the chip 11 are improved.

Here, as the thickness DP of the part 10g of the wafer 10 becomes larger, the water is surely prevented from penetrating into the construction 12. However, as the thickness DP becomes lager, the part 10g is not easily cut and separated when the shear stress is applied to the part 10g by expanding the dicing film 32. Thus, it is difficult to cut the wafer 10 with high accuracy.

Thus, the thickness DP of the part 10g of the wafer 10 is appropriately determined to cut the wafer 10 accurately and to prevent the water from penetrating into the construction 12 on the basis of an experiment.

Thirdly, as shown in FIG. 5, an outer periphery sidewall of the chip 11, which is a cutting surface of the wafer 10, is defined as a first periphery sidewall. On the first periphery sidewall, no reforming region R is disposed. Another outer periphery sidewall of the chip 11, which is a cutting surface of the cap portion 16, is defined as a second periphery sidewall. On the second periphery sidewall, the reforming regions R are formed.

The part 10g of the wafer 10 is disposed at the connection portion between the first periphery sidewall and the second periphery sidewall. The part 10 g is disposed on the same plane as the second periphery sidewall. Further, the part 10g is protruded from the first periphery sidewall by a half of the width W of the notch 10f, and the part 10g having the thickness DP is protruded from the first periphery sidewall.

Thus, the first periphery sidewall of the wafer 10 other than the part 10g as the connection portion is set back from the second periphery sidewall of the cap portion 16 by the half of the width W of the notch 10f.

Accordingly, it is determined by investigating an outer periphery sidewall of the chip 11 that the chip 11 is manufactured by the above method.

Fourthly, the wafer 10 is partially cut by the blade dicing method, and the cap portion 16 and the part 10g of the wafer 10 are cut by the laser beam dicing method. Accordingly, the throughput of the chips 11 is higher than a conventional method only by using the laser beam dicing method. Thus, the above method is suitably used for mass production.

Second Embodiment

Figure 6:
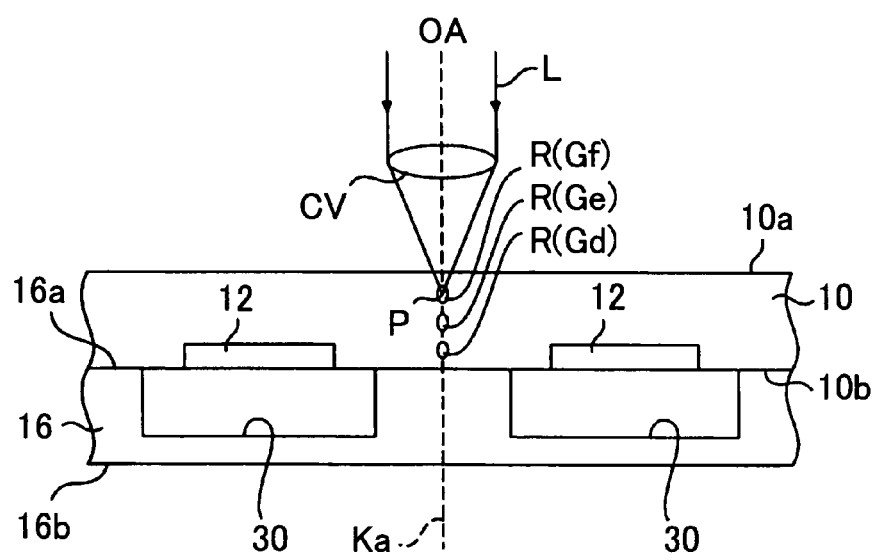
FIG. 6 is a cross sectional view showing a wafer taken along line I-I in FIG. 12 and explaining a dicing process according to a second embodiment.
Figure 7:
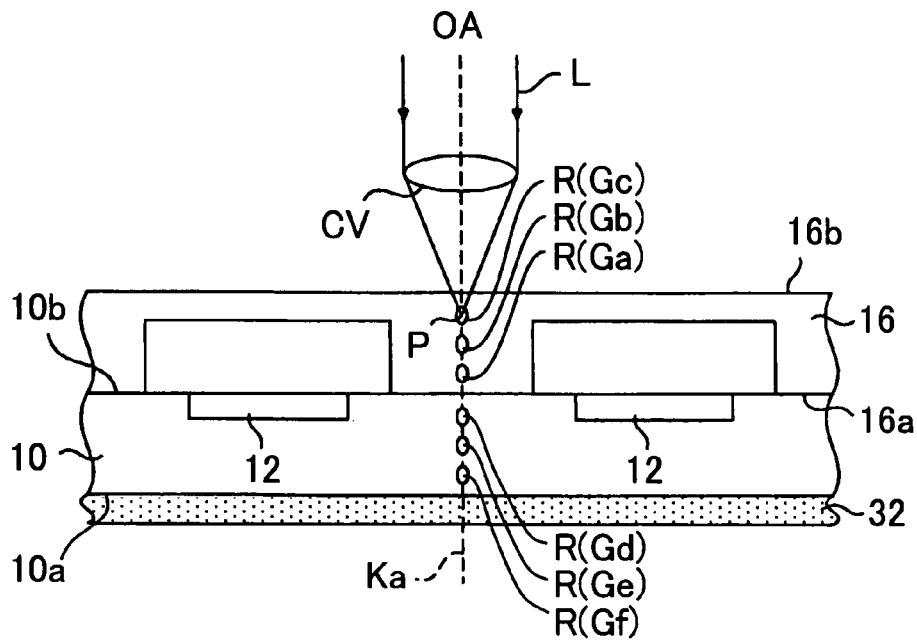
FIG. 7 is a cross sectional view showing the wafer taken along line I-I in FIG. 12 and explaining the dicing process according to the second embodiment.
Figure 8:
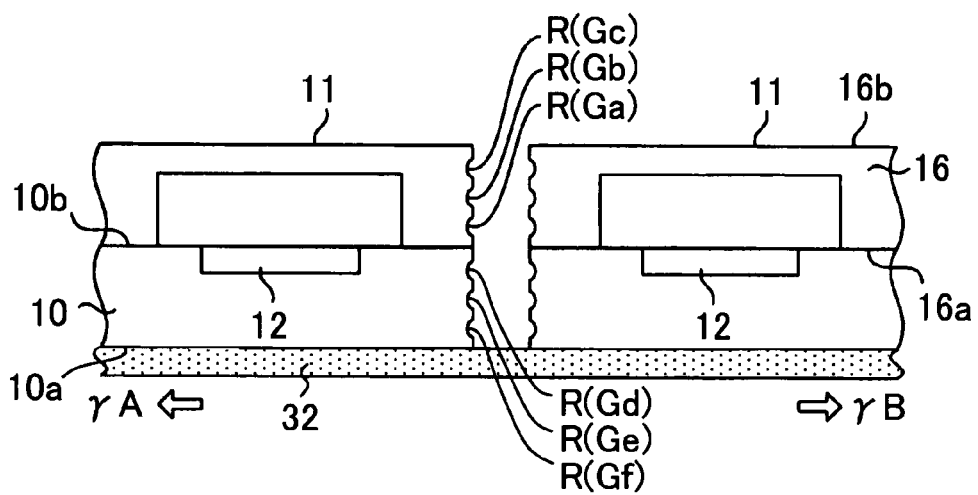
FIG. 8 is a cross sectional view showing the wafer taken along line I-I in FIG. 12 and explaining the dicing process according to the second embodiment.

FIGS. 6 to 8 show a dividing step of the wafer 10 according to a second embodiment.

FIG. 6 shows a first step. The backside surface 10a of the wafer 10 turns up, and the wafer 10 is mounted on the laser beam processing device.

The laser beam processing device irradiates the laser beam L in a pulse manner on the backside surface 10a of the wafer 10 and focuses at the focus point P in the wafer 10. Further, the reforming regions R are formed in the wafer 10 along with the cutting line Ka by the multi photon absorption effect. The focus point P is displaced relative to the wafer 10, so that one reforming layer Gd-Gf composed of multiple reforming regions R is formed in the wafer 10. The reforming regions R in the one reforming layer Gd-Gf are arranged at predetermined intervals along with a predetermined horizontal direction parallel to the surface 10b and the backside surface 10a of the wafer 10.

The depth of the focus point P in the wafer 10 is changed in a stepwise manner, so that multiple reforming layers Gd-Gf are formed in the wafer 10 sequentially. The reforming layers Gd-Gf are separated each other, adjacent to each other or overlapped each other in the depth direction along with the cutting line Ka.

FIG. 7 shows a second step. The dicing film 32 is bonded to the backside surface 10a of the wafer 10.

Then, the wafer 10 turns upside down so that the surface 10b of the wafer 10 turns up. Under this condition, the wafer 10 is mounted on the stage of the laser beam processing device.

Then, similar to the third step shown in FIGS. 3 and 4, multiple reforming layers Ga-Gc are formed in the cap portion 16.

FIG. 8 shows a fourth step. Similar to the fourth step shown in FIG. 5, the dicing film 32 is expanded along with a direction γA-γB perpendicular to the cutting line Ka.

Thus, the tensile stress is applied to the reforming layers Ga-Gc in the cap portion 16 and to the reforming layers Gd-Gf in the wafer 10.

Thus, the shear stress is applied to the inside of the wafer 10. Firstly, the crack is generated from the bottom layer Gf as a starting point of cracking. The bottom layer Gf is nearest the dicing film 32. The crack is generated along with the depth direction of the wafer 10. Then, the crack is generated from the middle layer Ge as a starting point along with the depth direction. Then, the crack is generated from the top layer Gd as a starting point. Thus, the crack from each layer Gd-Gf grows and is connected each other. The grown crack reaches the surface 10b and the backside surface 10a. Thus, the wafer 10 is cut and separated along with the cutting line Ka.

Then, the shear stress is generated in the cap portion 16. Similar to the fourth step shown in FIG. 5, the crack from each reforming layer Ga-Gc grows and is connected each other. The grown crack reaches the surface 16b and the backside surface 16a of the cap portion 16. Thus, the cap portion 16 is cut and separated. Finally, the chip 11 is separated from the wafer 10.

In a conventional method, when the laser beam L is irradiated on the backside surface 10a of the wafer 10 such that the laser beam L is focused at the focus point P in the wafer 10 and the cap portion 16, a refraction index at the wafer 10 is different from that at the cap portion 16 since the optical characteristics among the wafer 10, the cap portion 16 and the bonding member 20 are different. Therefore, a part of the laser beam L is reflected at boundaries among the wafer 10, the cap portion 16 and the bonding member 20, and the reflected beam and the incident beam interfere with each other so that they are cancelled each other. Thus, the energy of the laser beam L is much reduced in a deep portion from the backside surface 10a of the wafer 10, which is an incident surface of the laser beam L. Thus, in the deep portion, the energy of the laser beam L is not sufficient to generate the multi photon absorption effect. Accordingly, the reforming region R is not sufficiently formed in the deep portion. Here, the bonding member 20 bonds the cap portion 16 and the wafer 10. In some cases, no bonding member 20 is disposed on the cutting line Ka. For example, the bonding member 20 is disposed outside of the construction 12, and inside of the cap portion 16. In this case, since the optical characteristics among the cap portion 16, the wafer 10 and an air layer between the cap portion 16 and the wafer 10 are different, the refraction index of the laser beam L at the wafer 10 is different from that at the cap portion 16 or at the air layer. Thus, a part of the laser beam L is reflected at boundaries among the wafer 10, the cap portion 16 and the air layer, and the reflected beam and the incident beam interfere with each other so that they are cancelled each other.

However, in this embodiment, after the reforming layers Gd-Gf are formed in the wafer 10, the wafer 10 turns upside down. Then, the reforming layers Ga-Gc are formed in the cap portion 16.

Specifically, when the reforming layers Gd-Gf are formed in the wafer 10, the laser beam L is irradiated on the backside surface 10a of the wafer 10. When the reforming layers Ga-Gc are formed in the cap portion 16, the laser beam L is irradiated on the surface 16b of the cap portion 16. Thus, the laser beam L is not reflected at the boundaries among the wafer 10, the cap portion 16 and the bonding member 20.

Thus, the reforming layers Ga-Gf are accurately and surely formed.

Since the reforming layers Ga-Gf are formed in the wafer 10 and the cap portion 16, the wafer 10 and the cap portion 16 are accurately cut and separated along with the cutting line Ka without forming an unwanted crack. Thus, the product yielding ratio and the quality of the chip 11 are improved.

Further, in the second embodiment, the wafer 10 is not cut by the blade dicing method. Thus, when the wafer 10 and the cap portion 16 are cut without using cooling and washing water. The cutting scrap and the water do not penetrate into the construction 12. Therefore, the product yielding ratio and the quality of the chip 11 are much improved.

The first step may be performed after the second step. Specifically, the laser beam L is irradiated on the surface 16b of the cap portion 16 so that the reforming layers Ga-Gc are formed in the cap portion 16. Then, the dicing film 32 is bonded to the surface 16b of the cap portion 16, and the wafer 10 turns upside down. Then, similar to the first step shown in FIG. 6, the laser beam L is irradiated on the backside surfacer 10a of the wafer 10 so that the reforming layers Gd-Gf are formed in the wafer 10. Then, similar to the third step shown in FIG. 8, the dicing film 32 is expanded so that the wafer 10 and the cap portion 16 are cut and separated. Thus, the chip 11 is separated from the wafer 10.

Third Embodiment

Figure 9:
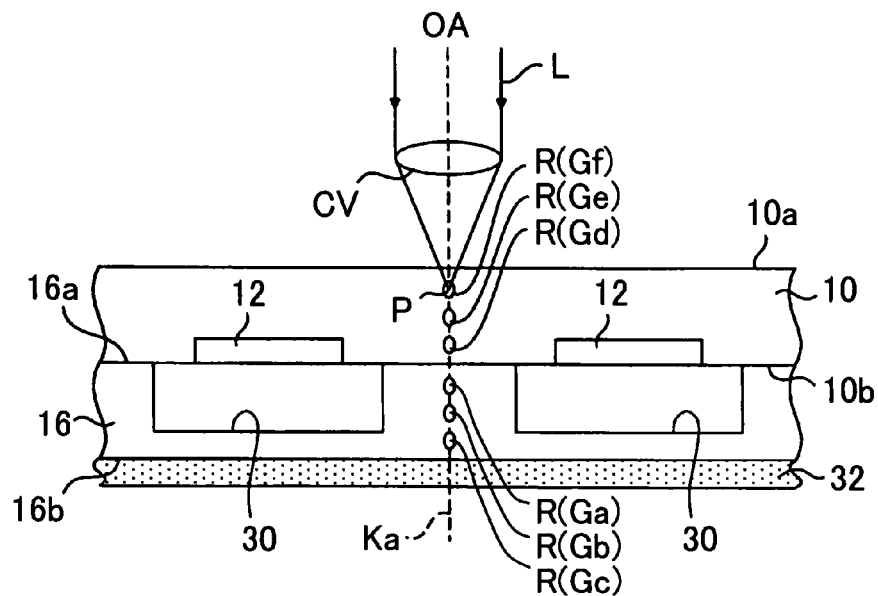
FIG. 9 is a cross sectional view showing a wafer taken along line I-I in FIG. 12 and explaining a dicing process according to a third embodiment.
Figure 10:
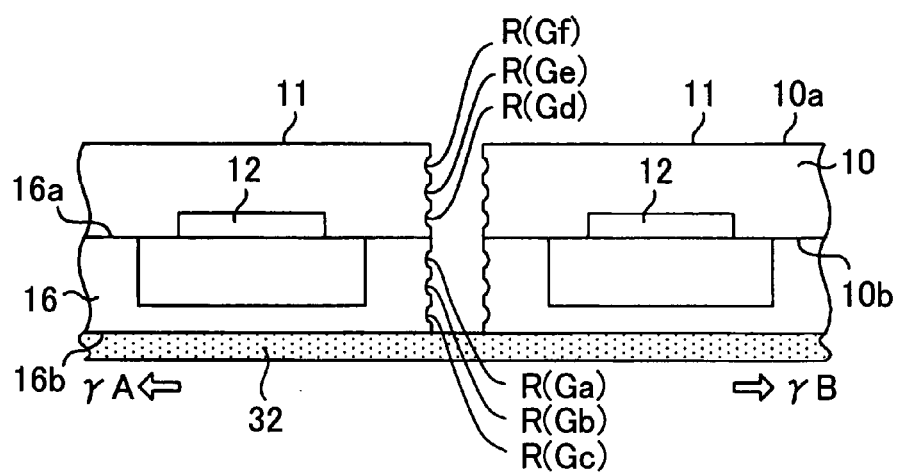
FIG. 10 is a cross sectional view showing the wafer taken along line I-I in FIG. 12 and explaining the dicing process according to the third embodiment.

FIGS. 9 and 10 show a dividing step of the wafer 10 according to a third embodiment.

FIG. 9 shows a first step. The dicing film 32 is bonded to the surface 16b of the cap portion 16.

Then, the wafer 10 is mounted on the stage of the laser beam processing device under the condition that the backside 10a of the wafer 10 turns up.

The laser beam processing device forms the reforming layers Ga-Gc in the cap portion 16. Then, similar to the first step shown in FIG. 6, the reforming layers Gd-Gf are formed in the wafer 10.

FIG. 10 shows a second step. Similar to the fourth step shown in FIG. 5, the dicing film 32 is expanded in the horizontal direction γA-γB perpendicular to the cutting line Ka.

Thus, the tensile stress is applied to the reforming layers Ga-Gf. Firstly, the cap portion 16 is cut and separated. Then, the wafer 10 is cut and separated. Accordingly, the chip 11 is separated from the wafer 10.

In FIG. 9, after the reforming layers Ga-Gc are formed in the cap portion 16, the reforming layers Gd-Gf are formed in the wafer 10 successively.

Thus, the wafer 10 and the cap portion 16 are cut and separated without using the blade dicing method. Thus, the chip 11 is separated from the wafer 10 without using the cooling water, so that the cutting scrap of the wafer 10 and the cap portion 16 and the cooling and washing water do not penetrate into the construction. Thus, the product yielding ratio and the quality of the chip 11 are improved.

In this embodiment, firstly, the dicing film 32 may be bonded to the backside surface 10a of the wafer 10, and then, the laser beam L may be irradiated on the surface 16b of the cap portion 16 so that the reforming layers Gd-Gf are formed in the wafer 10. After that, the laser beam L may be irradiated on the surface 16b of the cap portion 16 successively so that the reforming layers Ga-Gc are formed in the cap portion 16. Then, similar to the second step shown in FIG. 10, the dicing film 32 may be expanded so that the chip 11 is cut and separated.

Modifications

Although the wafer 10 includes the construction 12, and the cap portion 10 covers the wafer 10, the wafer 10 may have another construction. For example, the wafer may be made of a double-layered semiconductor substrate. Specifically, the wafer 10 may include a silicon substrate and a glass substrate, which are bonded together by an anodic bonding method.

When the wafer 10 is made of the above double-layered semiconductor substrate including a first layer and a second layer disposed on the first layer, the separating method shown in FIGS. 1-5 may be performed. In this case, the backside surface of the first layer is partially cut by the dicing blade with protecting the layers from penetrating the cutting scrap and the cooling water into a clearance between the first and second layers. Thus, the product yielding ratio and the quality of the chip 11 are improved. Further, the sealing of the clearance between the first and second layers may be simplified or eliminated, so that a manufacturing cost of the chip 11 is reduced.

Further, the separating method shown in FIGS. 6-8 may be performed to separate the wafer 10 made of the double-layered semiconductor substrate. In this case, the laser beam L is firstly irradiated on the backside surface of the first layer so that the reforming layers are formed in the first layer. Then, the laser beam L is irradiated on the surface of the second layer so that the reforming layers are formed in the second layer. Thus, the laser beam L is not reflected at the boundary between the first and second layers, so that the reforming regions R can be formed in each layer appropriately and accurately.

Although the wafer 10 is made of a bonded SOI substrate, the wafer 10 may be made of another semiconductor substrate such as a gallium arsenide substrate.

Further, the wafer 10 may be made of another material such as glass.

Although the cap portion 16 is made of silicon, the cap portion 16 may be made of another material such as glass.

When the wafer 10 and/or the cap portion 16 are made of another material, the reforming region R may be a region other than the melting process region. For example, when the wafer 10 and/or the cap portion 16 are made of glass, the reforming region R may be a crack region or a region having different refraction index.

The reforming region R including the crack region or the region having different refraction index is disclosed in US Patent Application Publication No. 2006-0160331.

Although the dicing film 32 is expanded so that the wafer 10 and the cap portion 16 are cut and separated, a rounded surface member having a predetermined curvature such as a semi-spherical member may press-contact the backside surface 10a of the wafer 10 or the surface 16b of the cap portion 16 along with the cutting line Ka so that the shear stress is generated at the reforming layers Ga-Gf. Thus, the wafer 10 and the cap portion 16 are cut and separated.

The above disclosure has the following aspects.

According to a first aspect of the present disclosure, a method for dicing a wafer including a first layer and a second layer is provided. The second layer is disposed on the first layer so that a front surface of the first layer contacts a backside surface of the second layer. The method includes: forming a sealing film on the second layer to cover a front surface of the second layer and a part of the front surface of the first layer in a liquid-tightly manner, the part of the front surface of the first layer exposed from the second layer; cutting the first layer from a backside surface of the first layer along with a cutting line so that a notch is formed on the backside surface of the first layer; removing the sealing film from the second layer; irradiating a laser beam on the front surface of the second layer along with the cutting line after the removing the sealing film in such a manner that the laser beam is focused on an inside of the second layer in order to form a reforming region in the second layer by a multi photon absorption effect; and dividing the wafer along with the cutting line from the reforming region as a starting point of dividing.

In the above method, since the sealing film covers the front surface of the second layer and the part of the front surface of the first layer in liquid-tightly manner, a cutting scrap and cooling water do not penetrate into a clearance between the first and second layers. Thus, product yielding ratio and quality of chips are improved. Further, since the notch is formed by cutting, throughput of the method becomes higher. Here, the first layer corresponds to the wafer 10, and the second layer corresponds to the cap portion 16.

Alternatively, in the cutting the first layer, the notch may be partially formed in the first layer so that a remaining part of the first layer is provided in a thickness direction perpendicular to the backside surface of the first layer. In this case, the cutting scrap and the cooling water do not penetrate into the clearance between the first and second layers.

Alternatively, the first layer may include a movable portion disposed on the front surface of the first layer, and the second layer is a protection member for protecting the movable portion of the first layer.

Alternatively, the method may further include: forming a dicing film on the backside surface of the first layer after the cutting the first layer from the backside surface. The dividing the wafer includes expanding the dicing film along with a horizontal direction, which is perpendicular to the cutting line and parallel to the backside surface of the first layer.

According to a second aspect of the present disclosure, a method for dicing a wafer including a first layer and a second layer is provided. The second layer is disposed on the first layer so that a front surface of the first layer contacts a backside surface of the second layer. The method includes: irradiating a laser beam on a backside surface of the first layer along with a cutting line in such a manner that the laser beam is focused on an inside of the first layer in order to form a first reforming region in the first layer by a multi photon absorption effect; irradiating the laser beam on a front surface of the second layer along with the cutting line in such a manner that the laser beam is focused on an inside of the second layer in order to form a second reforming region in the second layer by the multi photon absorption effect; and dividing the wafer along with the cutting line from the first and second reforming regions as a starting point of dividing.

In the above method, the reforming regions are accurately and surely formed in the first and second layers. Thus, product yielding ratio and quality of chips are improved. Here, the first layer corresponds to the wafer 10, and the second layer corresponds to the cap portion 16.

Alternatively, the irradiating the laser beam on the front surface of the second layer may be performed after the irradiating the laser beam on the backside surface of the first layer.

Alternatively, the irradiating the laser beam on the backside surface of the first layer may be performed after the irradiating the laser beam on the front surface of the second layer.

Alternatively, the method may further include: forming a dicing film on the backside surface of the first layer after the irradiating the laser beam on the backside surface of the first layer. The dividing the wafer includes expanding the dicing film along with a horizontal direction, which is perpendicular to the cutting line and parallel to the backside surface of the first layer.

According to a third aspect of the present disclosure, a method for dicing a wafer including a first layer and a second layer is provided. The second layer is disposed on the first layer so that a front surface of the first layer contacts a backside surface of the second layer. The method includes: irradiating a laser beam on a backside surface of the first layer along with a cutting line in such a manner that the laser beam is focused on an inside of the second layer in order to form a second reforming region in the second layer by a multi photon absorption effect; irradiating the laser beam on the backside surface of the first layer along with the cutting line in such a manner that the laser beam is focused on an inside of the first layer in order to form a first reforming region in the first layer by the multi photon absorption effect; and dividing the wafer along with the cutting line from the first and second reforming regions as a starting point of dividing.

In the above method, the reforming regions are accurately and surely formed in the first and second layers. Thus, product yielding ratio and quality of chips are improved. Here, the first layer corresponds to the wafer 10, and the second layer corresponds to the cap portion 16.

Alternatively, the method may further include: forming a dicing film on a front surface of the second layer. The dividing the wafer includes expanding the dicing film along with a horizontal direction, which is perpendicular to the cutting line and parallel to the front surface of the second layer.

According to a fourth aspect of the present disclosure, a chip includes: a first layer; a second layer disposed on the first layer. The first layer has a first periphery sidewall. The second layer has a second periphery sidewall. The second periphery sidewall includes a reforming region on the second periphery sidewall. The first periphery sidewall includes no reforming region on the first periphery sidewall. The reforming region is provided by a multi photon absorption effect of irradiation of a laser beam. In the above chip, product yielding ratio and quality of a chip are improved. Here, the first layer corresponds to the wafer 10, and the second layer corresponds to the cap portion 16.

Alternatively, the first periphery sidewall may further include a protrusion portion, which is disposed between the first periphery sidewall and the second periphery sidewall. The protrusion portion is disposed on a same plane as the second periphery sidewall, and the protrusion portion protrudes from the first periphery sidewall.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for dicing a wafer including a first layer and a second layer, wherein the second layer is disposed on the first layer so that a front surface of the first layer contacts a backside surface of the second layer, the method comprising:
    forming a sealing film on the second layer to cover a front surface of the second layer and a part of the front surface of the first layer in a liquid-tightly manner, the part of the front surface of the first layer exposed from the second layer;
    cutting the first layer from a backside surface of the first layer along with a cutting line so that a notch is formed on the backside surface of the first layer;
    removing the sealing film from the second layer;
    irradiating a laser beam on the front surface of the second layer along with the cutting line after the removing the sealing film in such a manner that the laser beam is focused on an inside of the second layer in order to form a reforming region in the second layer by a multi photon absorption effect; and
    dividing the wafer along with the cutting line from the reforming region as a starting point of dividing.

2. The method for dicing a wafer according to claim 1, wherein
    in the cutting the first layer, the notch is partially formed in the first layer so that a remaining part of the first layer is provided in a thickness direction perpendicular to the backside surface of the first layer.

3. The method for dicing a wafer according to claim 1, wherein
    the first layer includes a movable portion disposed on the front surface of the first layer, and
    the second layer is a protection member for protecting the movable portion of the first layer.

4. The method for dicing a wafer according to claim 1, wherein
    the first layer is made of semiconductor.

5. The method for dicing a wafer according to claim 1, further comprising:
    forming a dicing film on the backside surface of the first layer after the cutting the first layer from the backside surface, wherein
    the dividing the wafer includes expanding the dicing film along with a horizontal direction, which is perpendicular to the cutting line and parallel to the backside surface of the first layer.

6. A method for dicing a wafer including a first layer and a second layer, wherein the second layer is disposed on the first layer so that a front surface of the first layer contacts a backside surface of the second layer, the method comprising:
    irradiating a laser beam on a backside surface of the first layer along with a cutting line in such a manner that the laser beam is focused on an inside of the first layer in order to form a first reforming region in the first layer by a multi photon absorption effect;
    irradiating the laser beam on a front surface of the second layer along with the cutting line in such a manner that the laser beam is focused on an inside of the second layer in order to form a second reforming region in the second layer by the multi photon absorption effect; and
    dividing the wafer along with the cutting line from the first and second reforming regions as a starting point of dividing.

7. The method for dicing a wafer according to claim 6, wherein
    the irradiating the laser beam on the front surface of the second layer is performed after the irradiating the laser beam on the backside surface of the first layer.

8. The method for dicing a wafer according to claim 6, wherein
    the irradiating the laser beam on the backside surface of the first layer is performed after the irradiating the laser beam on the front surface of the second layer.

9. The method for dicing a wafer according to claim 6, wherein
    the first layer includes a movable portion disposed on the front surface of the first layer, and
    the second layer is a protection member for protecting the movable portion of the first layer.

10. The method for dicing a wafer according to claim 6, wherein
    the first layer is made of semiconductor.

11. The method for dicing a wafer according to claim 6, further comprising:
    forming a dicing film on the backside surface of the first layer after the irradiating the laser beam on the backside surface of the first layer, wherein
    the dividing the wafer includes expanding the dicing film along with a horizontal direction, which is perpendicular to the cutting line and parallel to the backside surface of the first layer.

12. A method for dicing a wafer including a first layer and a second layer, wherein the second layer is disposed on the first layer so that a front surface of the first layer contacts a backside surface of the second layer, the method comprising:
    irradiating a laser beam on a backside surface of the first layer along with a cutting line in such a manner that the laser beam is focused on an inside of the second layer in order to form a second reforming region in the second layer by a multi photon absorption effect;
    irradiating the laser beam on the backside surface of the first layer along with the cutting line in such a manner that the laser beam is focused on an inside of the first layer in order to form a first reforming region in the first layer by the multi photon absorption effect; and
    dividing the wafer along with the cutting line from the first and second reforming regions as a starting point of dividing.

13. The method for dicing a wafer according to claim 12, wherein
    the first layer includes a movable portion disposed on the front surface of the first layer, and
    the second layer is a protection member for protecting the movable portion of the first layer.

14. The method for dicing a wafer according to claim 12, wherein
    the first layer is made of semiconductor.

15. The method for dicing a wafer according to claim 12, further comprising:
    forming a dicing film on a front surface of the second layer, wherein
    the dividing the wafer includes expanding the dicing film along with a horizontal direction, which is perpendicular to the cutting line and parallel to the front surface of the second layer.

* * * * *